United States Patent
Jenner et al.

(10) Patent No.: US 10,373,740 B2
(45) Date of Patent: Aug. 6, 2019

(54) COMMUNICATIONS CABLE WITH IMPROVED ISOLATION BETWEEN WIRE-PAIRS AND METAL FOIL TAPE

(71) Applicant: Panduit Corp., Tinley Park, IL (US)

(72) Inventors: Royal O. Jenner, Frankfort, IL (US); Masud Bolouri-Saransar, Orland Park, IL (US); Ronald A. Nordin, Naperville, IL (US); Paul W. Wachtel, Arlington Heights, IL (US); Stephen A. Thwaites, Walton, KY (US); Roy B. Kusuma, Cincinnati, OH (US); James D. Malkemus, Union, KY (US); Scott M. Brown, Independence, KY (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/057,307

(22) Filed: Aug. 7, 2018

(65) Prior Publication Data

US 2019/0074109 A1    Mar. 7, 2019

Related U.S. Application Data

(60) Provisional application No. 62/543,064, filed on Aug. 9, 2017.

(51) Int. Cl.
| | |
|---|---|
| *H01B 11/08* | (2006.01) |
| *H01B 11/00* | (2006.01) |
| *H01B 13/22* | (2006.01) |

(52) U.S. Cl.
CPC ......... *H01B 11/085* (2013.01); *H01B 11/002* (2013.01); *H01B 13/22* (2013.01)

(58) Field of Classification Search
CPC .... H01B 7/204; H01B 7/1845; H01B 7/2806; H01B 7/2825; H01B 11/08; H01B 11/00; H01B 11/002; H01B 11/085; H01B 11/1008; H01B 13/22; H02G 1/10; H02G 9/02; H02G 9/12
USPC ...................... 174/102 R, 33, 84 R
See application file for complete search history.

(56) References Cited

U.S. PATENT DOCUMENTS

| | | | |
|---|---|---|---|
| 2,591,794 A | 4/1952 | Ebel | |
| 3,701,840 A | 10/1972 | Willmore | |
| 5,650,666 A * | 7/1997 | Hartranft | ............. H01L 23/562 257/727 |
| 5,956,445 A | 9/1999 | Deitz, Sr. et al. | |
| 6,037,249 A * | 3/2000 | Chiang | ................. H01L 21/764 257/E21.573 |
| 7,145,080 B1 | 12/2006 | Boisvert et al. | |

(Continued)

*Primary Examiner* — Timothy J Thompson
*Assistant Examiner* — Guillermo J Egoavil
(74) *Attorney, Agent, or Firm* — Christopher S. Clancy; James H. Williams; Christopher K. Marlow

(57) ABSTRACT

A communications cable having a plurality of twisted pairs of conductors and various embodiments of a metal foil tapes between the twisted pairs and a cable jacket is disclosed. In some embodiments, a metal foil tape includes a discontinuous metal layer and a polymer layer bonded to the metal layer. Portions of the metal layer and the polymer layer are deformed to form a plurality of dimples, the dimples forming air gaps between the polymer layer and the cable core or a barrier layer if used. The air gaps lower the overall dielectric constant between the metal layer and the cable core, thereby lowering the alien capacitance of the communications cable.

5 Claims, 2 Drawing Sheets

(56) References Cited

U.S. PATENT DOCUMENTS

| | | | |
|---|---|---|---|
| 7,271,344 | B1 | 9/2007 | Stutzman et al. |
| 7,405,360 | B2 | 7/2008 | Clark et al. |
| 8,445,787 | B2 | 5/2013 | Nordin et al. |
| 8,735,726 | B2 | 5/2014 | Skocypec |
| 9,012,778 | B2 | 4/2015 | Nordin et al. |
| 9,129,727 | B2 | 9/2015 | Caveney et al. |
| 9,159,471 | B2 | 10/2015 | Nordin et al. |
| 9,336,928 | B2 | 5/2016 | Wiekhorst et al. |
| 2009/0294146 | A1* | 12/2009 | Nordin .................. H01B 11/08 174/33 |
| 2016/0301198 | A1* | 10/2016 | Manabe ................ H01B 7/045 |
| 2017/0271086 | A1* | 9/2017 | Kuzeci .................. B21D 33/00 |

* cited by examiner

COMMUNICATIONS CABLE WITH IMPROVED ISOLATION BETWEEN WIRE-PAIRS AND METAL FOIL TAPE

CROSS REFERENCE TO RELATED APPLICATIONS

This application claims priority to U.S. Provisional Application No. 62/543,064, filed Aug. 9, 2017, the subject matter of which is hereby incorporated by reference in its entirety.

BACKGROUND

As networks become more complex and have a need for higher bandwidth cabling, attenuation of cable-to-cable crosstalk (or "alien crosstalk") becomes increasingly important to provide a robust and reliable communications system. Alien crosstalk is primarily coupled electromagnetic noise that can occur in a disturbed cable arising from signal-carrying cables that run near the disturbed cable, and, is typically characterized as alien near end crosstalk (ANEXT), or alien far end crosstalk (AFEXT). To attenuate alien crosstalk, continuous or discontinuous metal foil tape may be wrapped around the inner core of a communications cable. Unterminated continuous metal foil tape cable systems can have unwanted electro-magnetic radiation and or susceptibility issues. A discontinuous metal foil tape cable system greatly reduces the electro-magnetic radiation and or susceptibility issues.

SUMMARY

A communications cable having a plurality of twisted pairs of conductors and various embodiments of a metal foil tapes between the twisted pairs and a cable jacket is disclosed. In some embodiments, a metal foil tape includes a discontinuous metal layer and a polymer layer bonded to the metal layer. Portions of the metal layer and the polymer layer are deformed to form a plurality of dimples, the dimples forming air gaps between the polymer layer and the cable core or a barrier layer if used. The air gaps lower the overall dielectric constant between the metal layer and the cable core, thereby lowering the alien capacitance of the communications cable.

BRIEF DESCRIPTION OF THE DRAWINGS

The following detailed description references the drawings, wherein.

DETAILED DESCRIPTION

Figure 1:
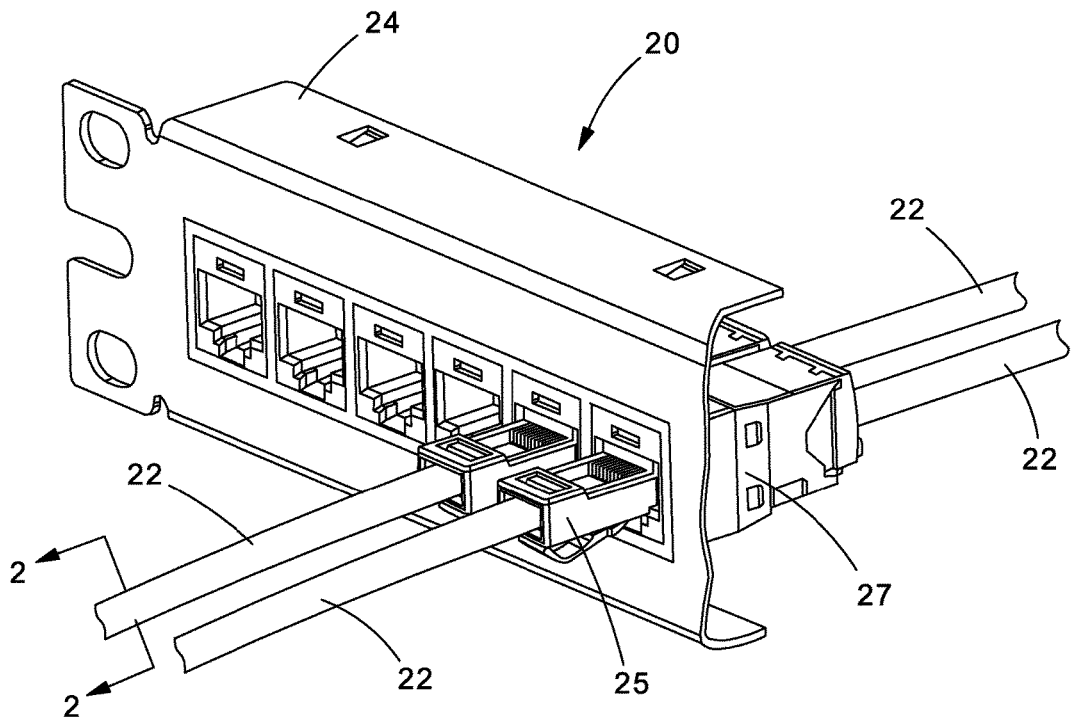
FIG. 1 is an illustration of a perspective view of a communications system.

Reducing the diameter of cabling systems, such as Category 6A cabling systems, is desirable because it allows for increased cabling density as networks become more complex. However, reducing cable diameter can bring the metal foil tape included therein closer to the conductor pairs of the cable, which can raise the internal capacitance between wire pairs and between wires within a pair of the cable. If the metal foil tape is physically close to the twisted wire pairs, a capacitive coupling can occur. This capacitive coupling can create effect the wire pair's impedance (reducing the return loss) and create coupling between wire pairs (i.e., both near and far end crosstalk).

Examples disclosed herein illustrate communications cable designs that include various embodiments of metal foil tapes (i.e., discontinuous metal foil tapes) positioned between the jacket and unshielded conductor pairs of the cables. The disclosed metal foil tapes may include dimples protruding inward toward the core of the cable which create space (i.e., air gaps) between the metal layer of the metal foil tapes and the cable core (or barrier tape, if used). The air gaps decrease the overall effective dielectric constant between the metal foil and the cable core, thereby reducing the internal capacitance of the communications cable.

Reference will now be made to the accompanying drawings. Wherever possible, the same reference numbers are used in the drawings and the following description to refer to the same or similar parts. It is to be expressly understood, however, that the drawings are for illustration and description purposes only. While several examples are described in this document, modifications, adaptations, and other implementations are possible. Accordingly, the following detailed description does not limit the disclosed examples. Instead, the proper scope of the disclosed examples may be defined by the appended claims.

FIG. 1 is a perspective view of a communications system 20, which includes at least one communications cable 22, connected to equipment 24. Equipment 24 is illustrated as a patch panel in FIG. 1, but the equipment can be passive equipment or active equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers/telecommunications rooms; security devices (cameras and other sensors, etc.) and door access equipment; and telephones, computers, fax machines, printers and other peripherals as can be found in workstation areas. Communications system 20 can further include cabinets, racks, cable management and overhead routing systems, and other such equipment.

Figure 2:
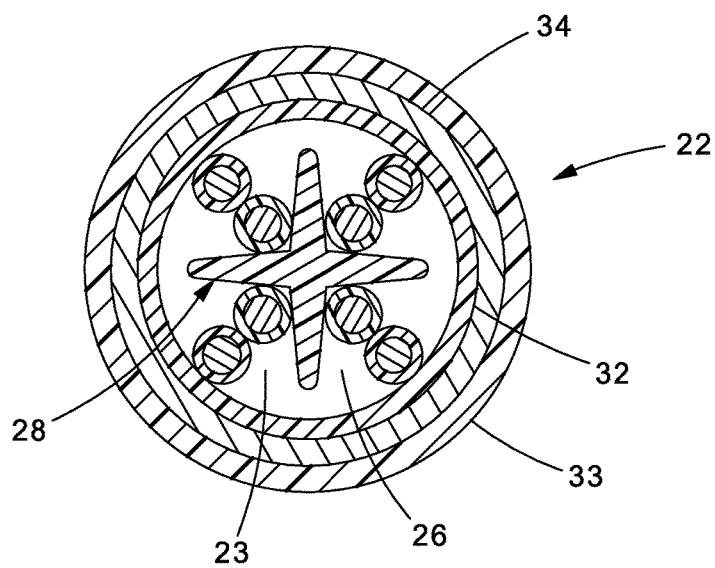
FIG. 2 is an illustration of a transverse cross-sectional view of a communications cable.

Communications cable 22 is shown in the form of an unshielded twisted pair (UTP) cable, and more particularly a Category 6A cable which can operate at 10 Gb/s, as is shown more particularly in FIG. 2. Communications cable 22 may, however, be a variety of other types of communications cables, as well as other types of cables. Communications cable 22 can be terminated directly into equipment 24, or alternatively, can be terminated in a variety of plugs 25 or jack modules 27 such as an RJ45 type, jack module cassettes, and many other connector types, or combinations thereof. Further, cables 22 can be processed into looms, or bundles, of cables, and additionally can be processed into pre-terminated looms.

Communication cable 22 can be used in a variety of structured cabling applications including patch cords, backbone cabling, and horizontal cabling, although the present invention is not limited to such applications. In general, the present invention can be used in military, industrial, telecommunications, computer, data communications, and other cabling applications.

Referring to FIG. 2, there is shown a transverse cross-section of communications cable 22, taken along section line 2-2 in FIG. 1. Communications cable 22 may include an inner cable core 23 with four twisted conductive wire pairs 26 that are separated with a pair separator 28. Pair separator 28 may be formed with a clockwise rotation (left hand lay) with a cable stranding or lay length. An example lay length may be 3.2 inches. Pair separator 28 can be made of a plastic, such as a solid fire-retardant polyethylene (FRPE), for example.

A wrapping of barrier tape 32 may surround inner core 23. Barrier tape 32 can be helically wound or longitudinally wrapped around inner core 23. As shown in FIG. 2, the twisted pair conductors may extend beyond pair separator 28 to create an outer diameter of inner core 23. The outer diameter may be, for example, approximately 0.2164 inches, and the circumference may be 0.679 inches. In some implementations, barrier tape 32 may wrap around inner core 23 slightly more than twice, and there may be two applications of barrier tape 32 in some implementations. Barrier tape 32 may be formed of a polymer or polymer-based material with non-conductive additives. Barrier tape 32 may be a solid, foamed, embossed, or perforated construction. To minimize alien capacitance in communications cable 22, barrier tape 32 may be designed such that it has a relatively low dielectric constant, such as a dielectric constant that approaches that of air (i.e., $\varepsilon_r=1$).

Metal foil tape 34 may be longitudinally wrapped around barrier tape 32 under cable jacket 33 along the length of communications cable 22. That is, metal foil tape 34 may be wrapped along its length such that it wraps around the length of communications cable 22 in a "cigarette" style wrapping. Alternatively, metal foil tape 34 may be helically wrapped around barrier tape 32.

Figure 3:
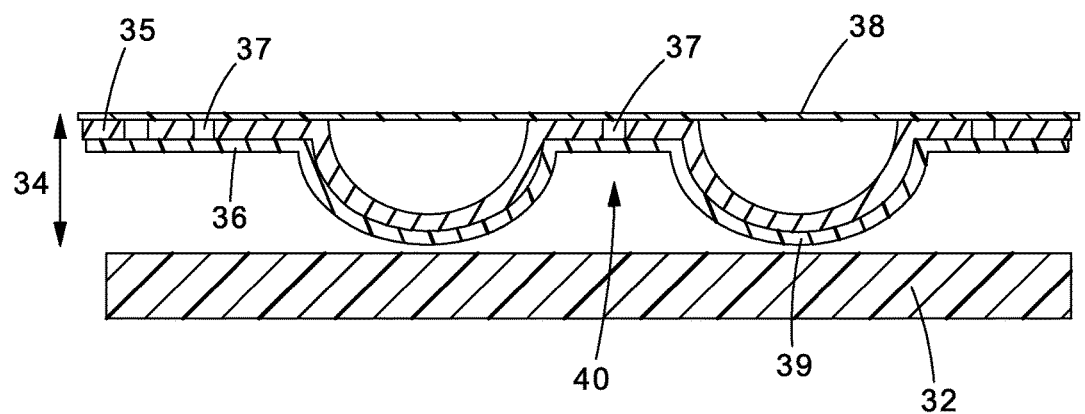
FIG. 3 is an illustration of a lengthwise cross-sectional view of a metal foil tape and barrier tape.

As shown in FIG. 3, metal foil tape 34 may comprise a metal (e.g., aluminum) layer 35 adhered to a polymer film support layer 36. In some implementations, metal layer 35 may be adhered to polymer layer 36 with an adhesive such as a glue. Metal foil tape 34 may be wrapped around barrier tape 32 such that metal layer 35 faces jacket 32 and polymer layer 36 faces inward toward inner core 23. An additional polymer layer (i.e., slick layer 38) may be applied to the top of metal layer 35 (e.g., at a 1 mil thickness) to assist in the manufacturing process without affecting the electrical performance of communications cable 22.

Discontinuities 37 may be created in metal layer 35, for example, in a post-processing step where lasers are used to ablate portions of metal layer 35. Discontinuities 37 may run in the longitudinal direction of communications cable 22 (i.e., along the length of communications cable 22), in the latitudinal direction of communications cable 22 (i.e., orthogonal to the length of communications cable 22), or combinations thereof. For example, discontinuities 37 may run both in the longitudinal and latitudinal directions of communications cable 22 to form a "brick" pattern in metal layer 35 when viewed from the top down.

The thickness of layers 35, 36, and 32, as well as the dielectric constants of the non-metal layers, may determine the capacitance of communications cable 22. Since it is desired to reduce the overall size of communications cable 22, in order to lower the capacitance of communications cable 22, the present disclosure describes a metal foil tape 34 that lowers the effective dielectric constant of communications cable 22, which in turn lowers the alien capacitance of communications cable 22.

To lower the effective dielectric constant of communications cable 22, the disclosed metal foil tape 34 is formed to include dimples 39 that protrude toward inner core 23. Dimples 39 may be U-shaped depressions formed in the metal layer 35 and polymer layer 36. Dimples 39 may be circular in shape or other shapes (e.g., elliptical, oblong, oval, etc.). Dimples 39 create air gaps (i.e., space filled with air) between barrier tape 32 and flat portions 40 of polymer layer 36. The air in the air gaps have a much lower dielectric constant than the polymer material of polymer layer 36, thereby reducing the effective dielectric constant of communications cable 22. By adjusting the height of dimples 39 and the spacing between neighboring dimples 39, the effective relative dielectric constant between inner core 23 and metal layer 35 can be reduced.

As an example, in FIG. 3, dimples 39 may be a height of 2 mils, flat portions 40 of polymer layer 36 may be a height of 1 mil, metal layer 35 may be a height of 0.3 mil, slick coating 38 may be a height of 1 mil, and barrier layer 32 may be a height of 6.7 mils. The total thickness in this example between inner core 23 and cable jacket 33 is 11 mils, and the total thickness between inner core 23 and metal layer 35 is 9.7 mils. With dimples 39 in metal foil tape 34, the overall effective dielectric constant between inner core 23 and metal layer 35 is $\varepsilon=1.39$. Accordingly, the corresponding capacitance may be calculated to be 7.4 $pF/cm^2$, which is a significant reduction in capacitance compared to a similar cable having no dimples (which may have a capacitance of 11 $pF/cm^2$). The significant reduction in capacitance allows for even thinner barrier tapes to be used, thereby reducing the overall thickness of communications cable 22 even further.

Figure 4:
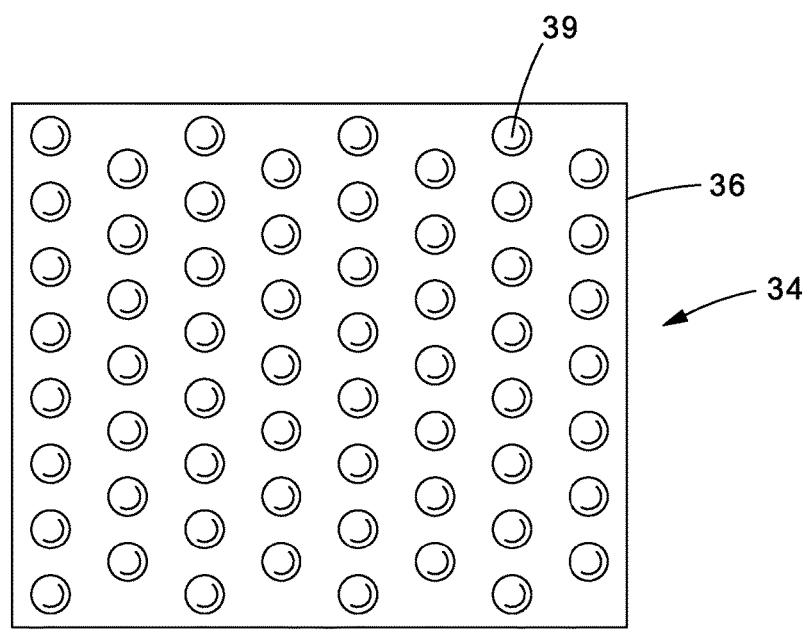
FIG. 4 is an illustration of a bottom view of a metal foil tape.

Dimples 39 may be formed in various patterns. For example, as shown in FIG. 4, dimples 39 may be formed in staggered rows. The staggering may run along the longitude of communications cable 22 or transverse to communications cable 22. The layout of dimples 39 may be optimized for best mechanical strength while keeping potential processing limitations (e.g., material or process related) in mind.

For example, the pattern of dimples 39 may be optimized to accommodate a disadvantage to dimpling after the laser processing has created discontinuities 37 through abatement of material in metal layer 35. The abatement process may produce a metal slit-width (or kerf) approximately 0.002 to 0.004 inches wide in metal layer 35. Metal foil tape 34 may be run through dimpling tooling to form dimples 39 after the abatement process has been completed. The dimpling tooling may include a rolling die set having a having a first hardened roller with protrusions and a second roller either elastic in nature or hardened with matching depressions sequenced to the first hardened roller. The protrusions deform portions of metal layer 34 and polymer layer 36 outwards such that the portions are displaced in a U-shape. The dimpling tooling may cause a change in the geometry of the kerf such that the kerf is disturbed if a dimple 39 is formed on or near the kerf. The disturbance may cause metal from metal layer 35 to stretch in such a manner that the electrical discontinuities 37 created via the abatement process are destroyed. Accordingly, dimples 39 may be patterned such that they enlarge the kerf verses collapse the kerf, or such that dimples 39 are placed were metal abatement will not occur.

The actual processing steps of dimple formation may be optimized to achieve desired embossing features on metal foil tape 34. For example, dimples 39 processing steps may be optimized by either actively avoiding the formation of dimples 39 near the kerf or by forming dimples 39 prior to the metal abatement process such that the kerf is formed after dimples 39. Moreover, the dimpling process can be employed in various steps of cable manufacturing to optimize its application to communications cable 22. For example, separate from the cable manufacturing process, the dimpling tooling may be utilized in a dimpling station on the laser abatement machine, pre or post laser abatement, and prior to metal foil tape rewind. As another example, the dimpling station can be utilized on a stand-alone web handling machine with. As a further example, the dimpling station can be utilized at a point-of-use of the metal foil tape during cable manufacture, such as at cable jacket application or cable stranding. Staging the dimpling station at point-of-use of the metal foil tape allows for the pre-dimpled tape to occupy much less space when wound on a bobbin, thereby saving on space during transport of the tape from lasering to cabling/jacketing. Moreover, once the tape is dimpled, the dimples are exposed to the possibility of being damaged (i.e., flattened). Accordingly, by waiting to dimple the metal foil tape just before it is applied to the cable reduces the risk of damage to the dimples.

Note that while the present disclosure includes several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and, should instead be understood as potentially combinable if such combinations are permissive. It should also be noted that there are many alternative ways of implementing the embodiments of the present disclosure. It is therefore intended that claims that may follow be interpreted as including all such alterations, permutations, and equivalents as fall within the true spirit and scope of the present disclosure.

The invention claimed is:

1. A method for manufacturing a communications cable, comprising:
   forming a cable core comprising a plurality of twisted pairs of conductors; and
   forming a barrier layer on the cable core;
   at a point-of-application step of applying a metal foil tape on the barrier layer, creating dimples by deforming a metal layer and a polymer layer of the metal foil tape; and
   after the dimples have been created, applying the metal foil tape onto the barrier layer.

2. The method of claim 1, wherein the point-of-application step is a cable jacket application step.

3. The method of claim 2, wherein creating the dimples in the metal foil tape at the cable jacket application step includes creating the dimples at a dimpling station between tape payoff of the metal foil tape prior to a jacket extrusion die.

4. The method of claim 1, wherein the point-of-application step is a cable stranding step.

5. The method of claim 4, wherein creating the dimples in the metal foil tape at the cable stranding step includes creating the dimples at a dimpling station between tape payoff of the metal foil tape prior to an application of the metal foil tape onto the barrier layer at a stranding machine.

* * * * *